(12) United States Patent
Yan et al.

(10) Patent No.: US 8,158,998 B2
(45) Date of Patent: Apr. 17, 2012

(54) HIGH-REFLECTIVITY AND LOW-DEFECT DENSITY LED STRUCTURE

(75) Inventors: Liang-Jyi Yan, Taipei County (TW); Yea-Chen Lee, Hsinchu County (TW)

(73) Assignee: High Power Opto, Inc., Taichung County (TW)

( * ) Notice: Subject to any disclaimer, the term of this patent is extended or adjusted under 35 U.S.C. 154(b) by 99 days.

(21) Appl. No.: 12/858,855

(22) Filed: Aug. 18, 2010

(65) Prior Publication Data
US 2012/0043522 A1 Feb. 23, 2012

(51) Int. Cl.
*H01L 33/00* (2010.01)
(52) U.S. Cl. .................. 257/98; 257/79; 257/E33.067; 257/E33.072
(58) Field of Classification Search ............ 257/98, 257/79, E33.067, E33.072
See application file for complete search history.

(56) References Cited

U.S. PATENT DOCUMENTS

| | | | |
|---|---|---|---|
| 6,781,944 B1 * | 8/2004 | Tanaka | 369/112.12 |
| 2010/0032701 A1 * | 2/2010 | Fudeta | 257/98 |
| 2010/0038659 A1 * | 2/2010 | Chen et al. | 257/98 |
| 2011/0049546 A1 * | 3/2011 | Heikman et al. | 257/98 |

* cited by examiner

*Primary Examiner* — Long Pham
(74) *Attorney, Agent, or Firm* — Muncy, Geissler, Olds & Lowe, PLLC

(57) ABSTRACT

The present invention discloses a high-reflectivity and low-defect density LED structure. A patterned dielectric layer is embedded in a sapphire substrate via semiconductor processes, such as etching and deposition. The dielectric layer is formed of two materials which are alternately stacked and have different refractive indexes. An N-type semiconductor layer, an activation layer and a light emitting layer which is a P-type semiconductor layer are sequentially formed on the sapphire substrate. An N-type electrode and a P-type electrode are respectively coated on the N-type semiconductor layer and the P-type semiconductor layer. The dielectric layer can lower the defect density of the light emitting layer during the epitaxial growth process. Further, the dielectric layer can function as a high-reflectivity area to reflect light generated by the light emitting layer and the light is projected downward to be emitted from the top or the lateral. Thereby is greatly increased the light-extraction efficiency.

10 Claims, 7 Drawing Sheets

HIGH-REFLECTIVITY AND LOW-DEFECT DENSITY LED STRUCTURE

FIELD OF THE INVENTION

The present invention relates to an LED structure, particularly to a high-reflectivity and low-defect density LED structure.

BACKGROUND OF THE INVENTION

Refer to FIG. 1 for a conventional blue light LED structure. In the conventional blue light LED structure, an N-type GaN (gallium nitride) layer 2, an activation layer 3 and a P-type GaN layer 4 are sequentially formed on a sapphire substrate 1. Then, an N-type electrode 5 and a P-type electrode 6 are respectively coated on the N-type GaN layer 2 and the P-type GaN layer 4. Thus is formed an LED structure.

There is intrinsic lattice mismatch between the sapphire substrate 1 and the N-type GaN layer 2/the P-type GaN layer 4. Thus, the N-type GaN layer 2 formed on the sapphire substrate 1 during an epitaxial process has a high-defect density. Thus the photoelectric performance of an LED component is degraded, the photoelectric efficiency is reduced and lifespan is shortened.

SUMMARY OF THE INVENTION

The primary objective of the present invention is to provide a low-defect density LED structure to enhance the photoelectric efficiency and lifespan of an LED.

Another objective of the present invention is to provide a high-reflectivity LED structure to increase the light-extraction efficiency of an LED.

To achieve the abovementioned objectives, the present invention proposes a high-reflectivity and low-defect density LED structure, which comprises a sapphire substrate, a patterned dielectric layer and a light emitting layer, wherein the dielectric layer is embedded in the surface of the sapphire substrate and is formed of two materials which are alternately stacked and have different refractive indexes. The light emitting layer is formed on the sapphire substrate.

In the present invention, the defect density can be greatly reduced after the material is epitaxially grown while the light emitting layer is formed on the sapphire substrate. Thus the photoelectric efficiency and lifespan of an LED component are enhanced. In addition, due to the dielectric layer is formed of two materials which are alternately stacked and have different refractive indexes, it can function as a high-reflectivity area to reflect light generated by the light emitting layer. Thus the light projected downward is emitted from the top or lateral of the LED component. Thereby is greatly increased the light-extraction efficiency of the LED component.

DETAILED DESCRIPTION OF THE PREFERRED EMBODIMENTS

The embodiments are described in detail to demonstrate the technical contents of the present invention. However, it should be understood that the embodiments are only to exemplify the present invention but not to limit the scope of the present invention.

Figure 1:
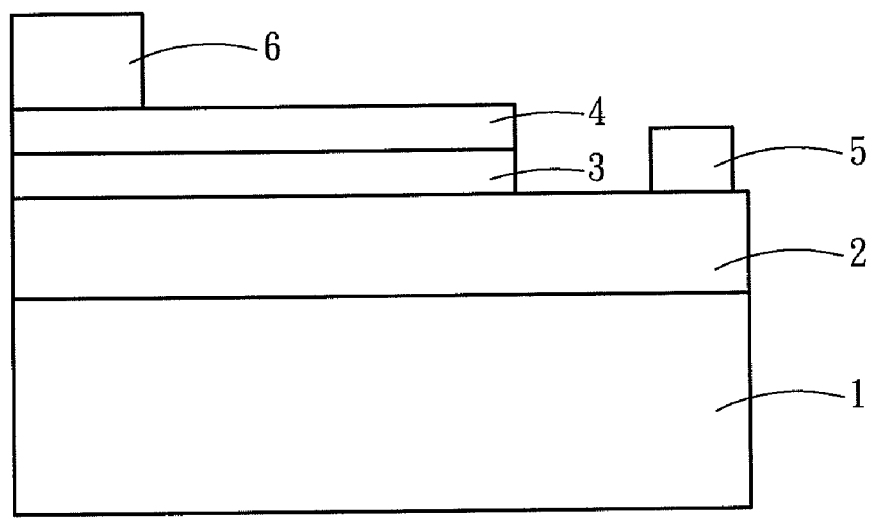
FIG. 1 is a sectional view schematically showing a conventional LED structure.
Figure 2:
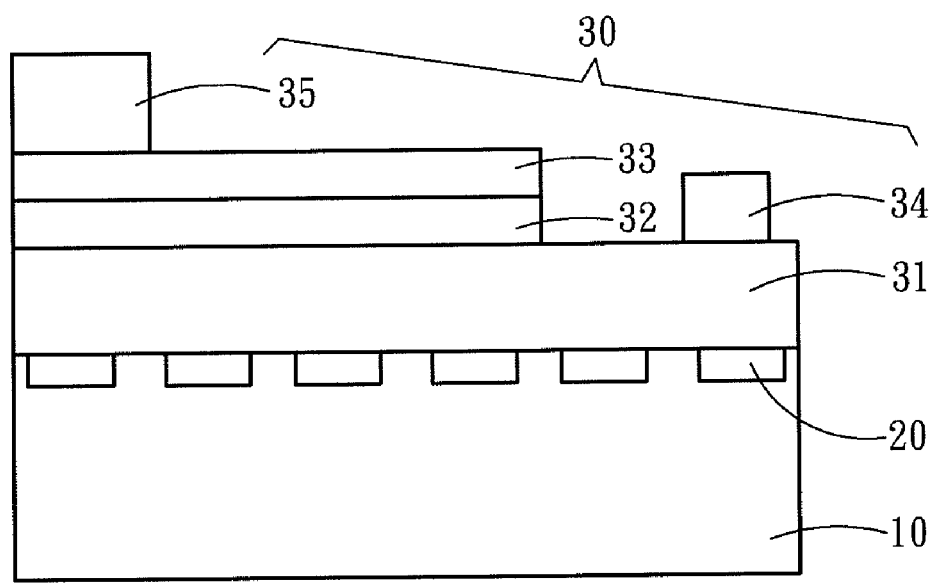
FIG. 2 is a sectional view schematically showing an LED structure according to one embodiment of the present invention.

Refer to FIG. 2. The present invention proposes a high-reflectivity and low-defect density LED structure, which comprises a sapphire substrate 10, a patterned dielectric layer 20 and a light emitting layer 30. The dielectric layer 20 is embedded in the surface of the sapphire substrate 10. The light emitting layer 30 is formed on the sapphire substrate 10.

The light emitting layer 30 further comprises an N-type semiconductor layer 31, an activation layer 32 and a P-type semiconductor layer 33. An N-type electrode 34 and a P-type electrode 35 are respectively coated on the N-type semiconductor layer 31 and the P-type semiconductor layer 33. The N-type semiconductor layer 31 and the P-type semiconductor layer 33 are respectively made of a material selected from a gallium nitride (GaN) system, such as gallium nitride (GaN), indium gallium nitride (InGaN), aluminum indium gallium nitride (AlInGaN) or aluminum nitride (AlN). The activation layer 32 includes Multiple Quantum Wells (MQWs) formed of periodical AlInGaN structures.

Figure 3:
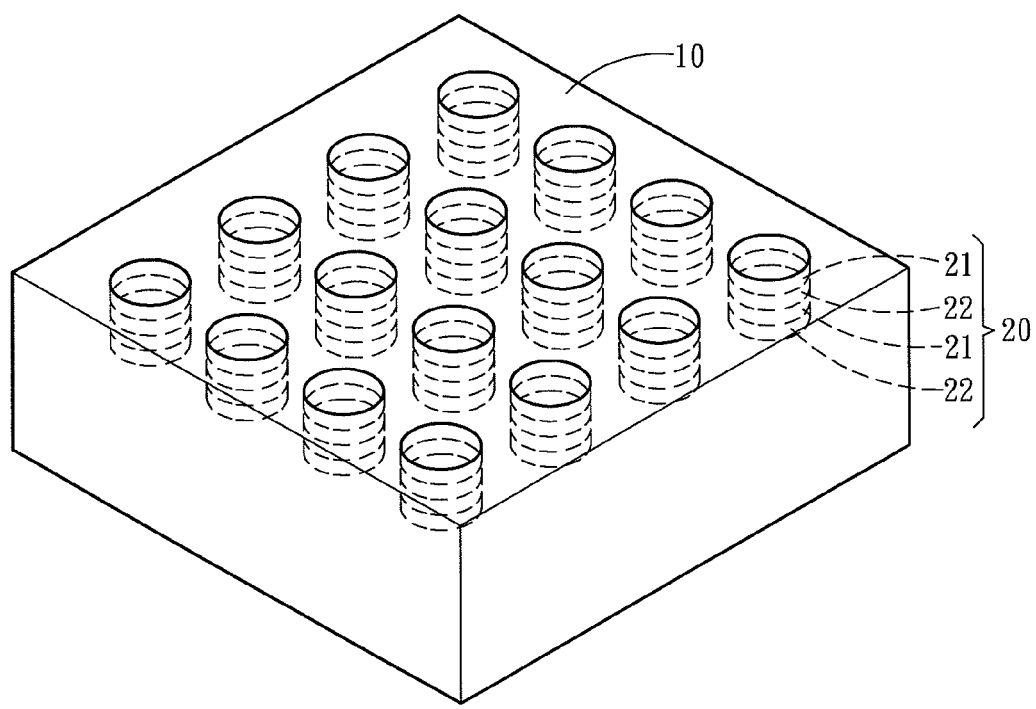
FIG. 3 is a diagram schematically showing the distribution of a dielectric layer according to one embodiment of the present invention.

Refer to FIG. 3. The dielectric layer 20 has periodical patterns. The pattern may be a cylinder, a polygonal column or a strip. In FIG. 3, cylinder is used to exemplify the pattern. The dielectric layer 20 is formed of two materials which are alternately stacked and have different refractive indexes. As shown in FIG. 3, the dielectric layer 20 contains two layers 21 with low refractive index and two layers 22 with high refractive index. The layer 22 with high refractive index is made of a material having a refractive index higher than 1.7, such as tantalum pentoxide ($Ta_2O_5$) (having refractive index of 2.2), hafnium dioxide ($HfO_2$) (having refractive index of 1.95), titanium dioxide ($TiO_2$) (having refractive index of 2.5), niobium pentoxide ($Nb_2O_5$) (having refractive index of 2.4), cerium dioxide ($CeO_2$) (having refractive index of 2.36), lithium niobate trioxide ($LiNbO_3$) (having refractive index of 2.38), zinc oxide (ZnO) (having refractive index of 2.1), indium tin oxide (ITO) (having refractive index of 2.12) or zirconium dioxide ($ZrO_2$) (having refractive index of 2.19). The layer 21 with low refractive index is made of a material having a refractive index lower than 1.7, such as silicon dioxide ($SiO_2$) (having refractive index of 1.46).

In a preferred embodiment, the pattern of the dielectric layer 20 has a surface area of 0.2-100 $\mu m^2$; the patterns of the dielectric layer 20 have a spacing of 0.5-10 $\mu m$; the dielectric layer 20 has a thickness of 0.1-5 $\mu m$.

Figure 4A:
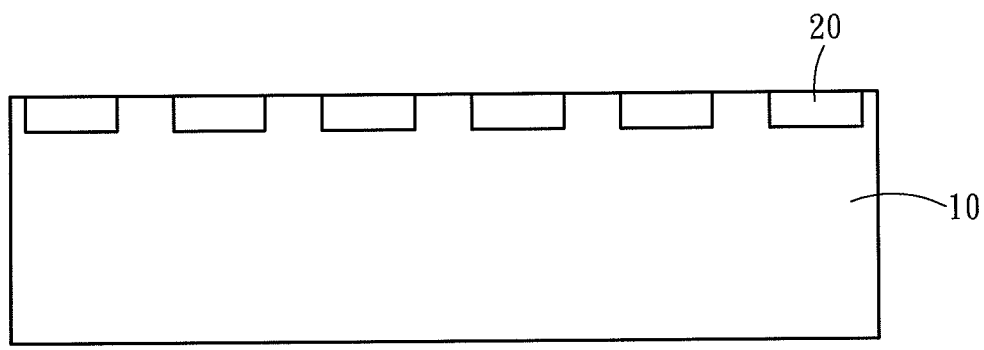
FIGS. 4A-4D are sectional view schematically showing an epitaxial process on a dielectric layer according to one embodiment of the present invention.
Figure 4B:
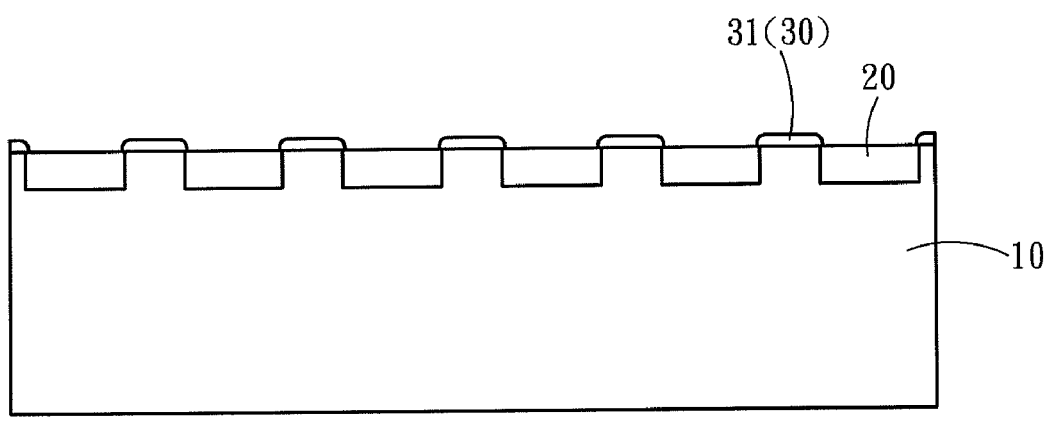
Figure 4C:
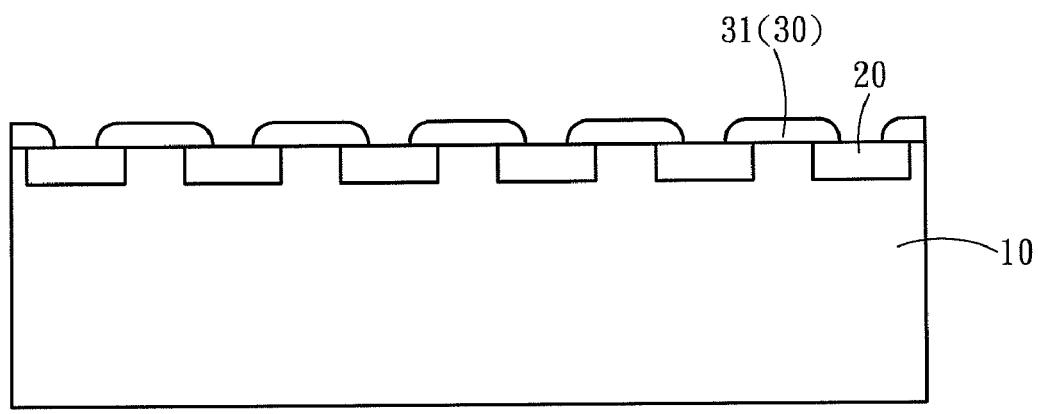
Figure 4D:
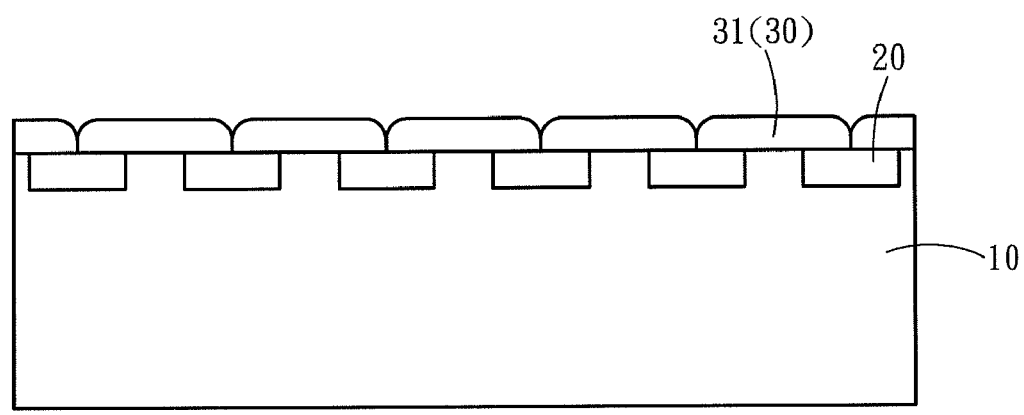

Refer to FIGS. 4A-4D. After the dielectric layer 20 is embedded in the surface of the sapphire substrate 10 (as shown in FIG. 4A), the N-type semiconductor layer 31 (the light emitting layer 30) is formed on the sapphire substrate 10 during an epitaxial process. At beginning, the N-type semiconductor layer 31 prefers to be formed on the regions free of dielectric layer 20 on the sapphire substrate 10 (as shown in FIG. 4B). When the epitaxial process is continued, the N-type semiconductor layer 31 is formed laterally to gradually cover the regions containing the dielectric layers 20 (as shown in FIG. 4C) until the dielectric layer 20 is completely covered by the N-type semiconductor layer 31 (as shown in FIG. 4D).

From the above description of the epitaxial growth process of the N-type semiconductor layer 31, it is known that the epitaxial growth of the N-type semiconductor layer 31 is laterally-formed. Thus, the N-type semiconductor layer 31 is free of lattice mismatch and thus has a superior epitaxy quality and a low defect density. Thereby are greatly enhanced the photoelectric efficiency and lifespan of an LED component.

In addition, due to the dielectric layer 20 is formed of two materials which are alternately stacked and have different refractive indexes, it can function as a high-reflectivity area to reflect the light generated by the light emitting layer 30. The light projected downward is emitted from the top or lateral of the LED component. Thereby is greatly increased the light extraction efficiency of the LED component.

What is claimed is:

1. A high-reflectivity and low-defect density light emitting diode structure, comprising:
   a sapphire substrate;
   a patterned dielectric layer embedded in a surface of the sapphire substrate and including two materials which being alternately stacked and including different refractive indexes; and
   a light emitting layer formed on the sapphire substrate and the dielectric layer.

2. The high-reflectivity and low-defect density light emitting diode structure according to claim 1, wherein the light emitting layer further comprises an N-type semiconductor layer, an activation layer and a P-type semiconductor layer.

3. The high-reflectivity and low-defect density light emitting diode structure according to claim 2, wherein the N-type semiconductor layer and the P-type semiconductor layer are respectively coated by an N-type electrode and a P-type electrode.

4. The high-reflectivity and low-defect density light emitting diode structure according to claim 2, wherein the N-type semiconductor layer and the P-type semiconductor layer are respectively made of a material selected from a group consisting of gallium nitride (GaN), indium gallium nitride (InGaN), aluminum indium gallium nitride (AlInGaN), and aluminum nitride (AlN).

5. The high-reflectivity and low-defect density light emitting diode structure according to claim 2, wherein the activation layer includes multiple quantum wells (MQWs) formed of periodical AlInGaN structures.

6. The high-reflectivity and low-defect density light emitting diode structure according to claim 1, wherein the dielectric layer including a high refractive index is made of a material selected from a group consisting of tantalum pentoxide ($Ta_2O_5$), hafnium dioxide ($HfO_2$), titanium dioxide ($TiO_2$), niobium pentoxide ($Nb_2O_5$), cerium dioxide ($CeO_2$), lithium niobate trioxide ($LiNbO_3$), zinc oxide (ZnO), indium tin oxide (ITO), and zirconium dioxide ($ZrO_2$); the dielectric layer including a low refractive index is made of a material of silicon dioxide ($SiO_2$).

7. The high-reflectivity and low-defect density light emitting diode structure according to claim 1, wherein the dielectric layer includes periodical patterns, and each of the patterns is formed in a shape of a cylinder, a polygonal column or a strip.

8. The high-reflectivity and low-defect density light emitting diode structure according to claim 7, wherein the pattern of the dielectric layer has a surface area of 0.2-100 $\mu m^2$.

9. The high-reflectivity and low-defect density light emitting diode structure according to claim 7, wherein the patterns of the dielectric layer have a spacing of 0.5-10 $\mu m$.

10. The high-reflectivity and low-defect density light emitting diode structure according to claim 7, wherein the dielectric layer has a thickness of 0.1-5 $\mu m$.

* * * * *